United States Patent
Huang et al.

(10) Patent No.: US 9,159,928 B2
(45) Date of Patent: Oct. 13, 2015

(54) AMINE-OXIDE-GROUP-CONTAINING CONJUGATED POLYMER PHOTOELECTRIC MATERIAL AND USE THEREOF

(71) Applicant: SOUTH CHINA UNIVERSITY OF TECHNOLOGY, Guangzhou, Guangdong (CN)

(72) Inventors: Fei Huang, Guangzhou (CN); Xing Guan, Guangzhou (CN); Kai Zhang, Guangzhou (CN); Yong Cao, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 14/382,238

(22) PCT Filed: Dec. 12, 2012

(86) PCT No.: PCT/CN2012/086424
§ 371 (c)(1),
(2) Date: Aug. 29, 2014

(87) PCT Pub. No.: WO2013/127227
PCT Pub. Date: Sep. 6, 2013

(65) Prior Publication Data
US 2015/0038602 A1    Feb. 5, 2015

(30) Foreign Application Priority Data

Feb. 29, 2012 (CN) .......................... 2012 1 0050653

(51) Int. Cl.
*H01L 51/00* (2006.01)
*C08G 61/02* (2006.01)
(Continued)

(52) U.S. Cl.
CPC ............ *H01L 51/0039* (2013.01); *C08G 61/02* (2013.01); *C08G 61/12* (2013.01);
(Continued)

(58) Field of Classification Search
CPC ......... H01L 51/39; H01L 51/43; H01L 51/42; H01L 51/5092; H01L 51/5072
USPC ................................... 528/401, 423
See application file for complete search history.

(56) References Cited

FOREIGN PATENT DOCUMENTS

CN    1555103 A    12/2004
CN    101139427 A    3/2008
(Continued)

OTHER PUBLICATIONS

Huang, et al, "Water/Alcohol Soluble Conjugated Polymers as High Efficient Electron Transporting/Injection Layer in Optoelectronic Devices", Chemical Society Reviews, vol. 39, 2010, pp. 2500-2521.

(Continued)

*Primary Examiner* — Shane Fang
(74) *Attorney, Agent, or Firm* — Oliff PLC

(57) ABSTRACT

Disclosed are an amine-oxide-group-containing conjugated polymer photoelectric material and application thereof. The amine-oxide-group-containing conjugated polymer photoelectric material consists of conjugated main chains and a side chain containing an amine oxide unit, and is applied in an organic photoelectric device. The material has desirable alcohol/water solubility and photoelectric properties, is suitable for making a multi-layer solution for machining a device, and meanwhile can prevent an adverse effect incurred by freely moving counter ions in a common polyelectrolyte to the device. The material may be used as a cathode interface modification layer applied in organic photoelectric devices such as light-emitting and photovoltaic devices, so as to improve performance of the devices.

2 Claims, 5 Drawing Sheets

(51) Int. Cl.
*C08G 61/12* (2006.01)
*H01L 51/42* (2006.01)
*H01L 51/50* (2006.01)

(52) U.S. Cl.
CPC ......... *C08G 61/122* (2013.01); *H01L 51/0043* (2013.01); *H01L 51/42* (2013.01); *C08G 2261/124* (2013.01); *C08G 2261/143* (2013.01); *C08G 2261/3142* (2013.01); *C08G 2261/411* (2013.01); *H01L 51/0037* (2013.01); *H01L 51/4253* (2013.01); *H01L 51/5072* (2013.01); *H01L 51/5092* (2013.01); *Y02E 10/549* (2013.01)

(56) References Cited

FOREIGN PATENT DOCUMENTS

| | | |
|---|---|---|
| CN | 102263205 A | 11/2011 |
| CN | 102304121 A | 1/2012 |
| CN | 102604048 A | 7/2012 |
| JP | 2000-273022 A | 10/2000 |
| WO | 2012/009484 A2 | 1/2012 |

OTHER PUBLICATIONS

Zeng, et al., "Polymer Light-Emitting Diodes with Cathodes Printed from Conducting Ag Paste," Advanced Materials, vol. 19, 2007, 810-814.

Huang et al., "A Conjugated, Neutral Surfactant as Electron-Injection Material for High-Efficiency Polymer Light Emitting Diodes", Advanced Materials, vol. 19, 2007, pp. 2010-2014.

Duan, et al., "Conjugated Zwitterionic Polyelectrolytes and Their Neutral Precursor as Electron Injection Layer for High-Performance Polymer Light-Emitting Diodes", Advanced Materials, vol. 23, 2011, pp. 1665-1669.

Guan, et al., "Amino N—Oxide Functionalized Conjugated Polymers and their Amino-Functionalized Precursors: New Cathode Interlayers for High-Performance Optoelectronic Devices", Advanced Funtional Materials, vol. 22, 2012, pp. 2846-2854.

Mar. 21, 2013 Search Report issued in International Application No. PCT/CN2012/086424.

Current density (Milliampere/cm2)

Wavelength (nm)

AMINE-OXIDE-GROUP-CONTAINING CONJUGATED POLYMER PHOTOELECTRIC MATERIAL AND USE THEREOF

TECHNICAL FIELD

The present invention relates to a macromolecular photoelectric material field, particularly to an amine-oxide-group-containing conjugated polymer photoelectric material and use thereof.

BACKGROUND ART

Since the first polymer electroluminescent diode was invented in 1990, the polymer photoelectric materials have brought a widespread interest in academia and industry.

In order to achieve a high efficient polymer electroluminescent device, it is critical to inject electrons and holes high-efficiently from the cathode and the anode respectively. Therefore, many high-efficient polymer electroluminescent devices employ a multi-layer device structure, ie., in addition to the luminescent layer, comprising one or more of the hole transport/injection layer or the electron transport/injection layer. Therefore, in addition to developing an excellent luminescent material, the development of an excellent electron transport/injection material and hole transport/injection material are also critical to achieve a high-efficient polymer electroluminescent device.

The previous studies have found that the conjugated polyelectrolyte as well as its neutral precursor is a very excellent electron injection/transport material, which has a good solubility in a polar solvent and at the same time has an excellent electron transport property, so as to make it possible to manufacture a high-efficient multi-layer polymer electroluminescent device. Moreover, such material can also effectively increase the electron injection from the high work function metals (such as Al, Ag, Au) to the polymer semiconductor, further facilitating to achieve a macromolecular multi-layer device in a printing manner (Adv. Mater. 2007, 19, 810.). The subsequent studies have demonstrated that such conjugated polyelectrolyte material not only can be used in the luminescent device but also can be used as an interface modification layer so as to significantly increase the performances of the organic solar cell and the field-effect transistor.

However, most of the conjugated polyelectrolytes have free-movable counter ions, which can possibly diffuse into the luminescent layer, thus effecting the long-term stability of the device. Moreover, both the response speed of the device and the charge mobility of the conjugated polyelectrolytes are greatly influenced by the counter ions.

SUMMARY OF THE INVENTION

In order to overcome the defects and deficiencies present in the prior art, the present invention provides an amine-oxide-group-containing conjugated polymer photoelectric material with excellent alcohol/water solubility and high-efficient electron transport/injection property, and use thereof.

The polymer provided in the present invention not only has very excellent alcohol/water solubility, but also has no free-movable ions; and can be used as an electron transport/injection material or interface modification material in the organic photoelectric device (such as organic luminescent diode, organic solar cells, and organic field effect transistor).

The present invention employs the following technical solution:

The amine-oxide-group-containing conjugated polymer of the present invention has the structure of:

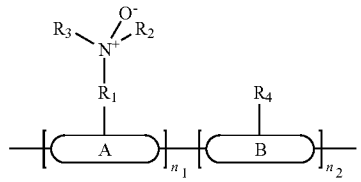

wherein, A, B are the conjugated main chain units; n1, n2 represent the relative contents of the A, B units respectively, and n1+n2=100%, $R_1$-$R_4$ are the C1~C20 linear alkyl, branched alkyl, cyclic alkyl chain or alkoxy chain;

A, B are the conjugated main chain units, and have one or more of the structures of:

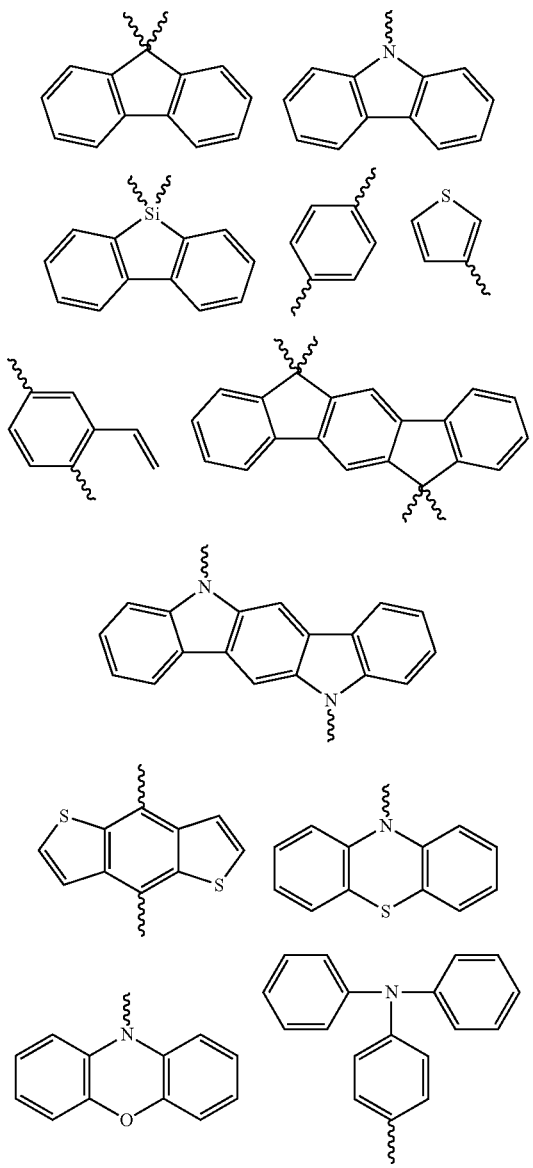

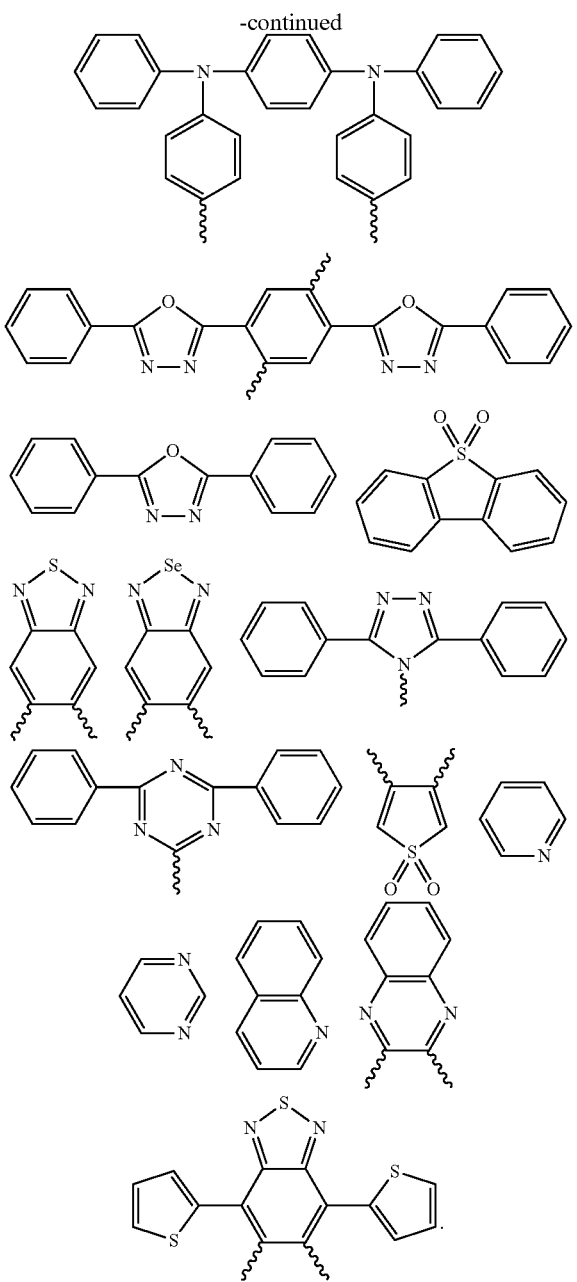

The amine-oxide-group-containing conjugated polymer photoelectric material is used in the organic photoelectric device.

As compared with those in the prior art, the present invention has the advantages of:

(1) the copolymer synthesized in the present invention has excellent electron injection/transport property, and is not influenced by the work function of the metal cathode, so that the high work function metal such as gold, silver, aluminum, etc., can be used as the cathode;

(2) the copolymer synthesized in the present invention contains the high polar amine oxide group, so the electron injection property is superior over the common neutral polar group-containing polymer; and as compared to the conjugated polyelectrolyte, the copolymer contains no moveable ions, so that when in use, there will not occur the decreased device performance caused by the ion migration;

(3) the amine-oxide-group-containing conjugated polymer synthesized in the present invention can be dissolved in the polar solvents such as methanol, ethanol, and generally the material of the active layer can not be dissolved in such solvents, so that when constructing the multilayer device, no intermiscible phenomena will occur between the active layer and the cathode interface modification layer.

DESCRIPTION OF EMBODIMENTS

Hereinafter, the present invention will be further described with embodiments, for the purpose of facilitating better understanding the contents of the present invention, particularly comprising synthesis, characterization and preparation of the devices, but these particular embodiments should not be construed as limiting the scope of protection of the present invention in any ways.

Figure 1:
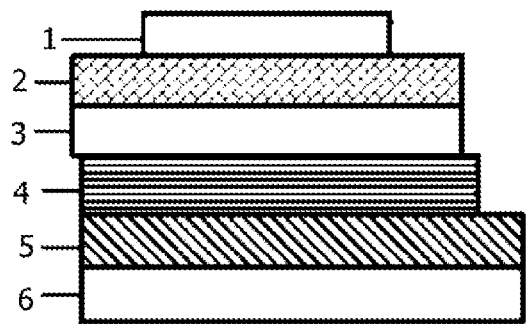
FIG. 1 is a structural schematic graph of the organic conjugated polymer luminescent diode and the organic/polymer solar cell used in the present invention.

The structures of the organic/polymer electroluminescent diode and the organic/polymer solar cells used in the present invention are shown in FIG. 1, both of which are constructed by laminating cathode 1, cathode interface modification layer 2, active layer 3, hole transfer layer 4, anode 5 and glass substrate 6 successively, and the cathode interface modification layers of the organic/polymer electroluminescent diode and the organic/polymer solar cell are both consisted of the amine-oxide-group-containing conjugated polymer material synthesized in the present invention.

The amine-oxide-group-containing conjugated polymer is characterized by the analysis measures such as nuclear magnetic resonance, gel permeation chromatography, elemental analysis, etc., and the electroluminescence of the polymer prepared by the abovementioned conjugated polymer and the performance of the solar cell device are also characterized.

Example 1

Synthesis of poly{2,7-[9,9'-bis(N,N-diethylhexyl-6-amineoxide)fluorene]} (PF6NO)

The synthetic route was as follows:

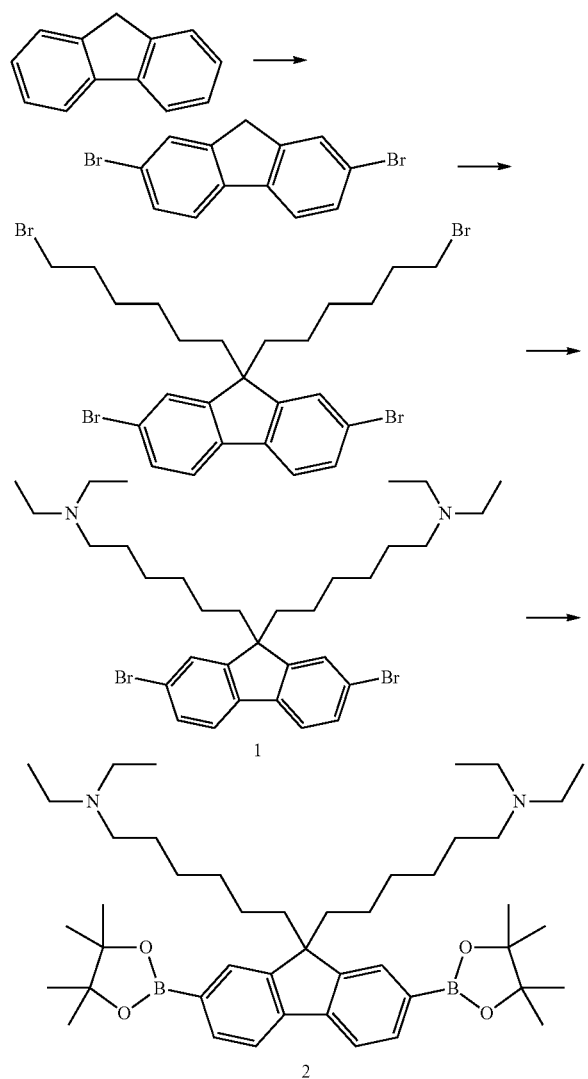

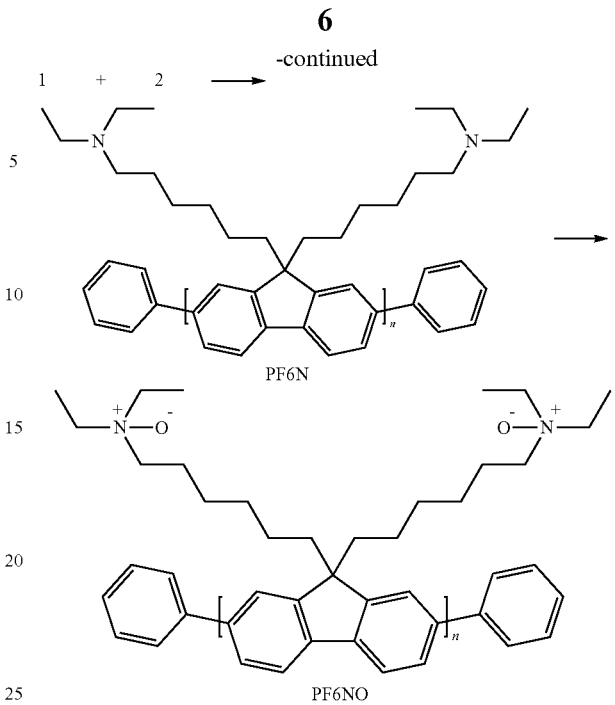

(1) the monomer 1, 2, prepared according to the method disclosed in the literature [Adv. Mater., 2011, 23, 1665];

(2) the preparation of poly{2,7-[9,9'-bis(N,N-diethyl-hexyl-6-amine)fluorene]} (PF6N)

The monomer 2,7-bis(trimethylene borate)-9,9'-bis(N,N-diethylhexyl-6-amine)fluorene (728 mg, 1 mmol), the monomer 2,7-dibromo-9,9'-bis(N,N-diethylhexyl-6-amine)fluorene (634 mg, 1 mmol) and 10 mg tetrakis triphenylphosphine palladium catalyst were dissolved in a mixture of 10 ml toluene and 5 ml tetrahydrofuran, 4 ml 2 mol/L of an aqueous sodium carbonate solution was added, the resulting solution was refluxed and reacted for 48 hrs under the protection of argon, then cooled down to ambient temperature, the reaction solution was precipitated in methanol so as to obtain a crude product, the crude product was dissolved in tetrahydrofuran, passed through a 0.45 μm organic filter membrane, concentrated, the resulting solution was precipitated in methanol so as to obtain polymer particles, the small molecular substances were removed off with acetone in a Soxhlet extractor, finally dried for 24 hrs at 45° in a vacuum drying oven, thus obtaining the product. 1H NMR (300 MHz, CDCl3, δ): 7.82-7.93 (m, 6H), 3.02-3.05 (m, 12H), 2.90-2.93 (m, 4H), 1.98-2.21 (m, 4H), 0.88-1.23 (m, 24H). Mn=13500, PDI=1.403;

(3) the preparation of poly{2,7-[9,9'-bis(N,N-diethyl-hexyl-6-amineoxide)fluorene]} (PF6NO)

100 mg PF6N was taken, 10 ml methanol was added, then an excess amount of 30% hydrogen peroxide solution was added, the reaction system was reacted for 2 days at ambient temperature, concentrated by distillation under reduced pressure, then 80 ml of ethyl acetate was added to precipitate a product, centrifuged and separated, and washed with chloroform, then dried for 24 hrs at 45° in a vacuum drying oven, thus obtaining the product. 1H NMR (300 MHz, CD3OD, δ): 7.82-7.93 (m, 6H), 3.22-3.24 (m, 12H), 3.07-3.18 (m, 4H), 1.56-1.57 (m, 4H), 1.18-1.23 (m, 24H).

Example 2

Synthesis of poly{2,7-[9,9'-bis(N,N-diethylhexyl-6-amineoxide)fluorene]-co-2,5-pyridine} (PF6NO25Py)

The synthesis route was as follows:

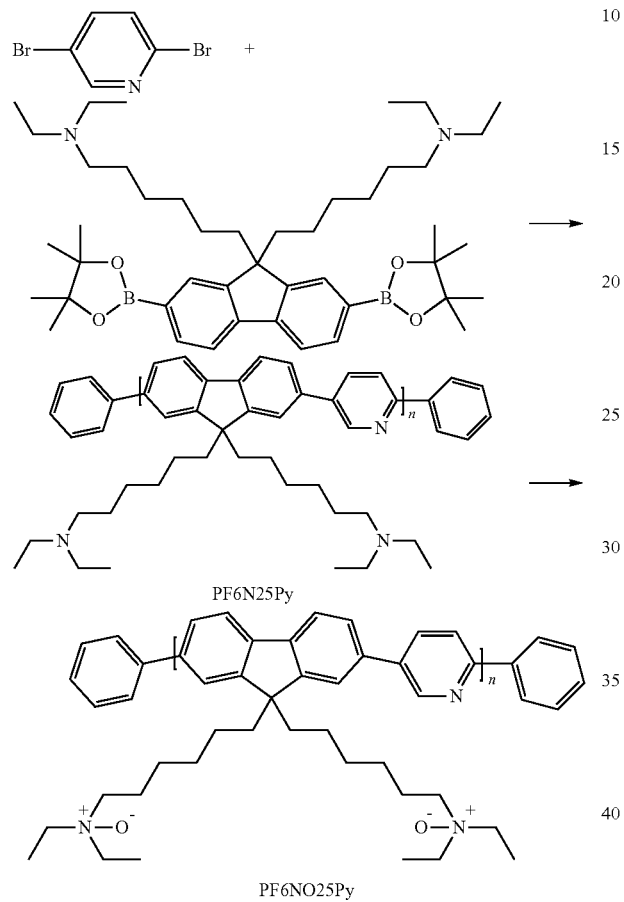

(1) the monomer 2,5-dibromopyridine, directly purchased from J&K Scientific Co., and recrystallized with methanol before use;

(2) the preparation of poly{2,7-[9,9'-bis(N,N-diethylhexyl-6-amine)fluorene]-co-2,5-pyridine} (PF6N25Py);

The monomer 2,7-bis(trimethylene borate)-9,9'-bis(N,N-diethylhexyl-6-amine)fluorene (728 mg, 1 mmol) prepared in example 1, the monomer 2,5-dibromopyridine (237 mg, 1 mmol) and 10 mg tetrakis triphenylphosphine palladium catalyst were dissolved in a mixed solvent of 10 ml toluene and 5 ml tetrahydrofuran, 4 ml 2 mol/L of an aqueous sodium carbonate solution was added, the resulting solution was refluxed and reacted for 48 hrs under the protection of argon, then cooled down to ambient temperature, the reaction solution was precipitated in methanol so as to obtain a crude product, the crude product was dissolved in tetrahydrofuran, passed through a 0.45 μm organic filter membrane, concentrated, the resulting solution was precipitated in methanol so as to obtain polymer particles, the small molecular substances were removed off with acetone in a Soxhlet extractor, finally dried for 24 hrs at 45° in a vacuum drying oven, thus obtaining the product. H NMR (300 MHz, CDCl3, δ): 9.08 (s, 1H), 7.62-8.15 (m, 8H), 2.40-2.45 (m, 12H), 2.27-2.29 (m, 4H), 1.21-1.24 (m, 4H), 1.08-1.10 (m, 8H), 0.90-0.96 (m, 12H), 0.84 (m, 4H). Mn=22401, PDI=1.607;

(3) the preparation of poly {2,7-[9,9'-bis(N,N-diethylhexyl-6-amineoxide)fluorene]-co-2,5-pyridine} (PF6NO25Py)

100 mg PF6N25Py was taken, 10 ml methanol was added, then an excess amount of 30% hydrogen peroxide solution was added, the reaction system was reacted for 2 days at ambient temperature, concentrated by distillation under reduced pressure, 80 ml of ethyl acetate was added to precipitate a product, centrifuged and separated, and washed with chloroform, then dried for 24 hrs at 45° in a vacuum drying oven, thus obtaining the product. $^1$H NMR (300 MHz, CD$_3$OD, δ): 9.06 (s, 1H), 7.88-8.54 (m, 8H), 3.09-3.12 (m, 12H), 2.87-2.89 (m, 4H), 1.50-1.52 (m, 4H), 0.98-1.18 (m, 24H).

Example 3

Synthesis of poly{2,7-[9,9'-bis(N,N-diethylhexyl-6-amineoxide)fluorene]-co-3,5-pyridine} (PF6NO35Py)

The synthesis route was as follows:

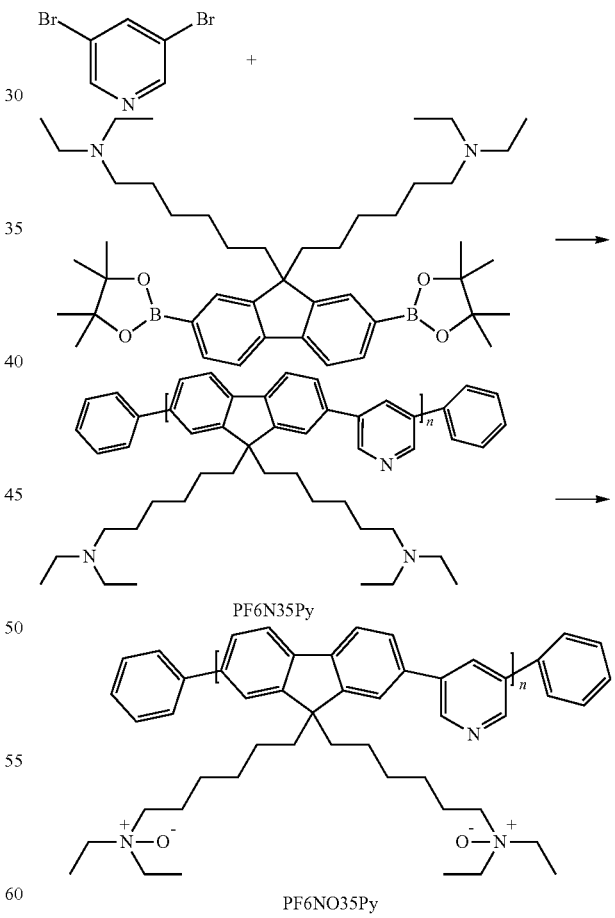

(1) the monomer 3,5-dibromopyridine, directly purchased from J&K Scientific Co., and recrystallized with methanol before use;

(2) the preparation of poly {2,7-[9,9'-bis(N,N-diethylhexyl-6-amine)fluorene]-co-3,5-pyridine} (PF6N35Py)

The monomer 2,7-bis(trimethylene borate)-9,9'-bis(N,N-diethylhexyl-6-amine)fluorene (728 mg, 1 mmol) prepared in example 1, the monomer 3,5-dibromopyridine (237 mg, 1 mmol) and 10 mg tetrakis triphenylphosphine palladium catalyst were dissolved in a mixed solvent of 10 ml toluene and 5 ml tetrahydrofuran, 4 ml 2 mol/L of an aqueous sodium carbonate solution was added, the resulting solution was refluxed and reacted for 48 hrs under the protection of argon, then cooled down to ambient temperature, the reaction solution was precipitated in methanol so as to obtain a crude product, the crude product was dissolved in tetrahydrofuran, passed through 0.45 μm organic filter membrane, concentrated, the resulting solution was precipitated in methanol so as to obtain polymer particles, the small molecular substances were removed off with acetone in a Soxhlet extractor, finally dried for 24 hrs at 45° C. in a vacuum drying oven, thus obtaining the product. $^1$H NMR (300 MHz, CDCl$_3$, δ): 8.90 (s, 2H), 8.23 (s, 1H), 7.91-7.92 (m, 2H), 7.66-7.73 (m, 4H), 2.66-2.73 (m, 8H), 2.50-2.56 (m, 4H), 2.11 (m, 4H), 1.40-1.41 (m, 4H), 1.09-1.11 (m, 8H), 1.02-1.07 (m, 12H), 0.74 (m, 4H), Mn=10300, PDI=1.553;

(3) the preparation of poly{2,7-[9,9'-bis(N,N-diethylhexyl-6-amineoxide)fluorene]-co-3,5-pyridine} (PF6NO35Py)

100 mg PF6N35Py was taken, 10 ml methanol was added, then an excess amount of 30% hydrogen peroxide solution was added, the reaction system was reacted for 2 day at ambient temperature, concentrated by distillation under reduced pressure, then 80 ml ethyl acetate was added to precipitate a product, centrifuged and separated, and washed with chloroform, then dried for 24 hrs at 45° in a vacuum drying oven, thus obtaining the product. $^1$H NMR (300 MHz, CD$_3$OD, δ): 8.92 (s, 2H), 8.50 (s, 1H), 8.03-8.05 (m, 2H), 7.88-7.94 (m, 4H), 3.09-3.16 (m, 8H), 2.97-3.01 (m, 4H), 2.30 (m, 4H), 1.53-1.54 (m, 4H), 1.14-1.28 (m, 20H), 0.94 (m, 4H).

Example 4

Synthesis of poly{2,7-[9,9'-bis(N,N-diethylhexyl-6-amineoxide)fluorene]-co-2,6-pyridine} (PF6NO26Py)

The synthesis route was as follows:

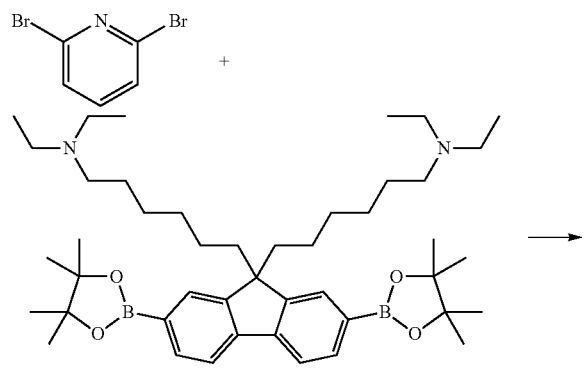

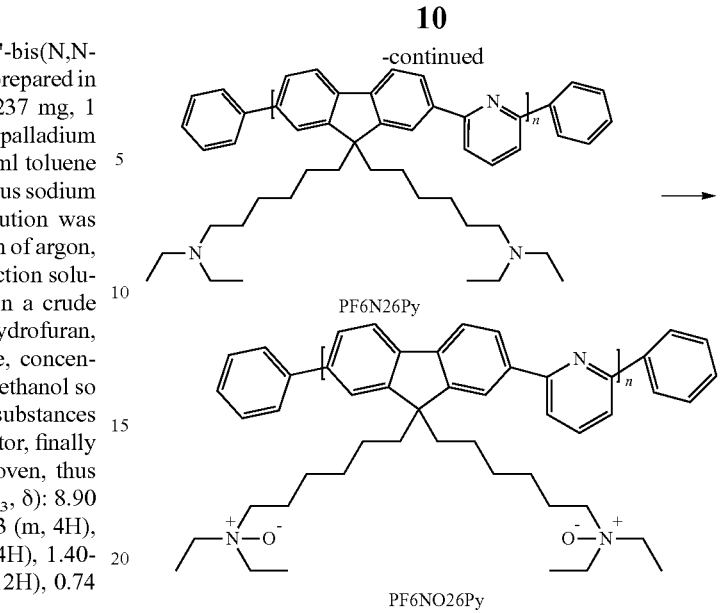

(1) the monomer 2,6-dibromopyridine, directly purchased from J&K Scientific Co., and recrystallized with methanol before use;

(2) the preparation of poly{2,7-[9,9'-bis(N,N-diethylhexyl-6-amine)fluorene]-co-2,6-pyridine} (PF6N26Py)

The monomer 2,7-bis(trimethylene borate)-9,9'-bis(N,N-diethylhexyl-6-amine)fluorene (728 mg, 1 mmol) prepared in example 1, the monomer 2,6-dibromopyridine (237 mg, 1 mmol) and 10 mg tetrakis triphenylphosphine palladium catalyst were dissolved in a mixed solvent of 10 ml toluene and 5 ml tetrahydrofuran, 4 ml 2 mol/L of an aqueous sodium carbonate was added, the resulting solution was refluxed and reacted for 48 hrs under the protection of argon, then cooled down to ambient temperature, the reaction solution was precipitated in methanol so as to obtain a crude product, the crude product was dissolved in tetrahydrofuran, passed through 0.45 μm organic membrane, concentrated, the resulting solution was precipitated in methanol so as to obtain polymer particles, the small molecular substances were removed off with acetone in a Soxhlet extractor, finally dried for 24 hrs at 45° C. in a vacuum drying oven, thus obtaining the product. $^1$H NMR (300 MHz, CDCl$_3$, δ): 8.29-8.31 (m, 2H), 8.16 (s, 2H), 7.81-7.94 (m, 5H), 2.38-2.45 (m, 8H), 2.25-2.30 (m, 4H), 2.18 (m, 4H), 1.25-1.28 (m, 4H), 1.10-1.12 (m, 8H), 0.91-0.97 (m, 12H), 0.81 (m, 4H). $M_n$=12100, PDI=1.587.

(3) the preparation of poly{2,7-[9,9'-bis(N,N-diethylhexyl-6-amineoxide)fluorene]-co-2,6-pyridine} (PF6NO26Py);

100 mg PF6N26Py was taken, 10 ml methanol was added, then an excess amount of 30% hydrogen peroxide solution was added, the reaction system was reacted for 2 days at ambient temperature, concentrated by distillation under reduced pressure, then 80 ml ethyl acetate was added to precipitate a product, centrifuged and separated, and washed with chloroform, then dried for 24 hrs, at 45° C. in a vacuum drying oven, thus obtaining the product. $^1$H NMR (300 MHz, CD$_3$OD, δ): 8.36-8.53 (m, 4H), 7.98-8.04 (m, 5H), 3.01-3.03 (m, 8H), 2.90-2.91 (m, 4H), 2.31 (m, 4H), 1.46-1.47 (m, 4H), 1.27-1.29 (m, 8H), 1.04-1.09 (m, 12H), 0.86 (m, 4H).

Example 5

Synthesis of poly{2,7-[9,9'bis(N,N-dihydroxyethyl-hexyl-6-amineoxide)fluorene]} (PF6OHNO)

The synthesis route was as follows:

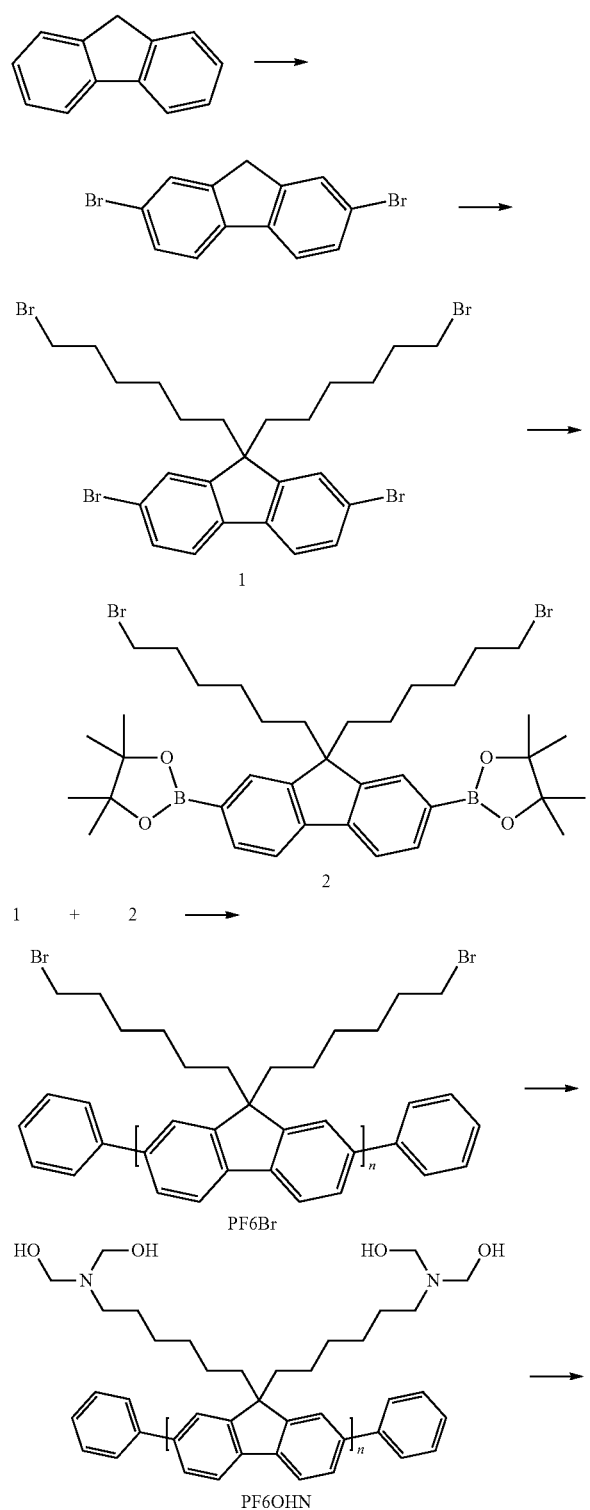

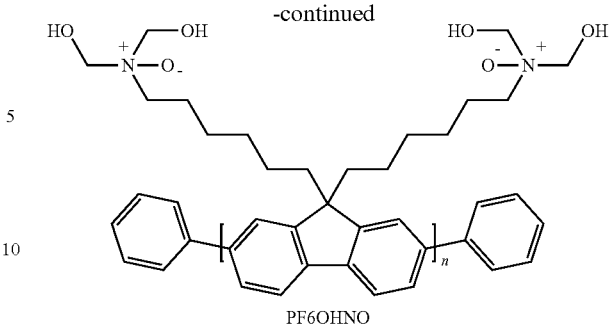

PF6OHNO (1) the monomers 1, 2 and the polymer precursors PF6Br, PF6OHN, prepared according to the method disclosed in the literature [Adv. Mater. 2007, 19, 2010];

(2) the preparation of poly{2,7-[9,9'-bis(N,N-dihydroxy-ethylhexyl-6-amineoxide)fluorene]} (PF6OHNO);

100 mg PF6OHN was taken, 10 ml methanol was added, then an excess amount of 30% hydrogen peroxide solution was added, the reaction system was reacted for 2 days at ambient temperature, concentrated by distillation under reduced pressure, then 80 ml ethyl acetate was added to precipitate a product, centrifuged and separated, and washed with chloroform, then dried for 24 hrs at 45° C. in a vacuum drying oven, thus obtaining the product. $^1$H NMR (300 MHz, $CD_3OD$, δ): 8.05-7.79 (m, 6H), 4.94 (m, 8H), 2.81-2.70 (m, 16H), 1.42-0.94 (m, 16H).

Example 6

Illustration of the Use of the Polymers as a Cathode Interface Modification Material in the Organic/Polymer Electroluminescence Devices (ITO Anode/Hole Transfer Layer/Luminescence Layer/Cathode Interface Modification Layer/Aluminium Cathode), with the Polymers PF6NO, PF6NO25Py, PF6NO35Py and PF6NO26Py Synthesized in Examples 1, 2, 3 and 4 as Examples The ITO electrically conductive glasses, square resistance ~20 Ohm/$cm^2$, were precut into 15 mm×15 mm square sheets. The square sheets were carried out a ultrasonic cleaning with acetone, the specific detergent for the micrometer scale semiconductor, deionized water and isopropanol successively, purged with nitrogen gas, then placed in a constant temperature oven for use. Prior to use, the ITO glass sheets were bombarded with plasmas for 10 min in an oxygen plasma etching instrument. The PEDOT:PSS aqueous dispersion solution (~1%) was purchased from Bayer Company, the buffering layer was spin-coated at a high speed with a Spin-Coater (KW-4A), the density was depended on the solution concentration and rotation speed, and was monitored in-time with a surface profilometer (Tritek Co., Alpha-Tencor-500 type). After a membrane was formed, the solvent resides were removed off in a constant temperature vacuum oven, and the membrane was erected. The sputtered PEDOT:PSS membrane on the ITO substrate was preferred to have a thickness of about 40 nm.

The fluorescent conjugated polymer P-PPV (P-PPV is a green light-emitting material) was weighted in a clean bottle, then transferred to a special film-forming glove box (VAC Company) under nitrogen protection, dissolved in toluene, filtrated through a 0.45 μm filter membrane. The fluorescent polymer was sputtered on the PEDOT:PSS membrane, the optimum thickness of the polymer luminescent layer was 70~90 nm. The thickness of the membrane was determined with an Alpha-Tencor-500 surface profilometer. The amine-oxide-group-containing conjugated polymer PF6NO, PF6NO25Py, PF6NO26Py and PF6NO35Py, as well as the amine group substituted precursor polymer PF6N, PF6N25Py, PF6N26Py and PF6N35Py were placed in a clean bottle, then transferred to a special film-forming glove box under nitrogen protection, formulated into a solution with a concentration of 0.5% using a polar solvent methanol, placed on a stirring platform and stirred to homogenous, filtrated through a 0.45 μm filter membrane, thus obtaining a clear solution. The solution was spin-coated as a cathode interface modification layer on a polymer luminescent layer. Aluminum (80 nm) was plated on the cathode interface modification layer by vacuum vaporization as a cathode. The vacuum level in the plating cavity was below $3 \times 10^{-4}$ Pa, and the film plating rate and the metal electrode membrane thickness of each layer were monitored in-time by a quartz oscillator film thickness monitor (Type STM-100, manufactured by Sycon Co.). The luminescence spectra of the devices were measured by a calibrated Instaspec IV charge coupled light detector CCD from ORIEL Company. The luminescence intensity and external quantum efficiency of the devices were measured by a semiconductor measurement system consisting of a Keithley236 electric current-voltage source and a calibrated silicon photoelectric diode. The external quantum efficiency and luminescence intensity were calibrated using a IS080 integrating sphere from Labsphere Company and PR705 spectrophotometer (Photoresearch) respectively. In order to show the effect of the cathode interface modification layer used in the present invention, Ba/Al and CsF/Al were plated on the luminescent layer by vacuum vaporization as a cathode, or Al was plated on the luminescent layer by vacuum vaporization as a cathode.

Figure 2:
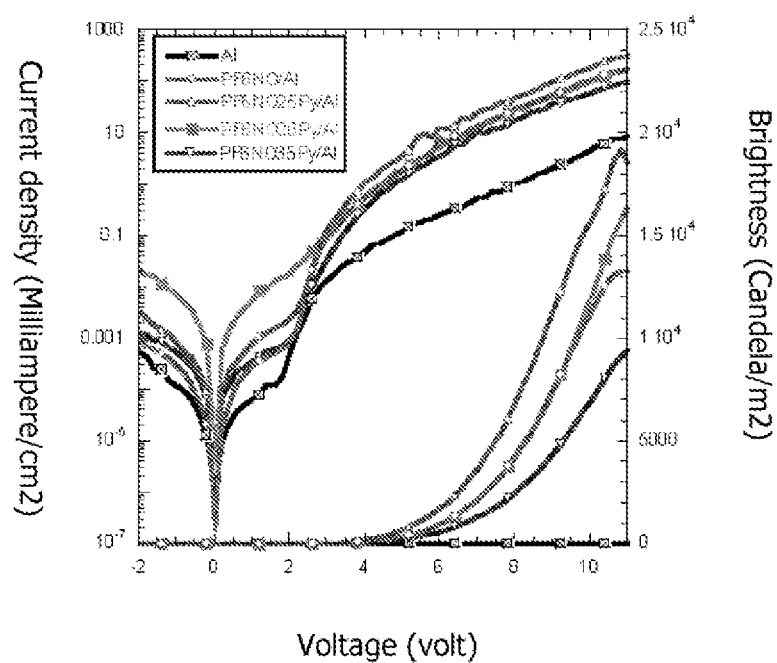
FIG. 2 is a current density/luminance brightness versus voltage graph of the green light material P-PPV-based organic electroluminescence devices using the polymers PF6NO, PF6NO25Py, PF6NO26Py and PF6NO35Py synthesized in examples 1, 2, 3 and 4 as the cathode interface modification layer.
Figure 3:
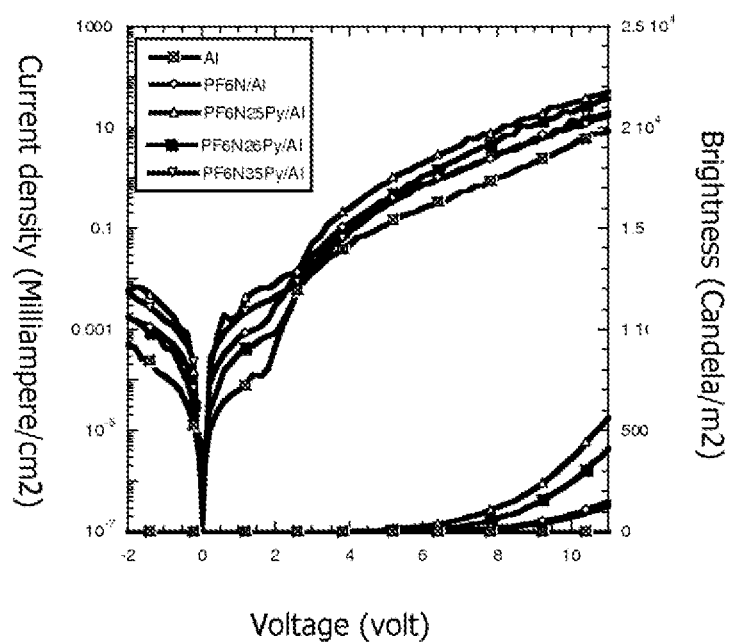
FIG. 3 is a current density/luminance brightness versus voltage graph of the green light material P-PPV-based organic electroluminescence devices using the precursors PF6N, PF6N25Py, PF6N26Py, PF6N35Py of the polymers PF6NO, PF6NO25Py, PF6NO26Py and PF6NO35Py synthesized in examples 1, 2, 3 and 4 as the cathode interface modification layer.

FIGS. 2 and 3, were the current density/luminescence brightness versus voltage graphs of the polymer luminescent diodes prepared by using a green light material-based polyphenyl substituted phenylenevinylene as a luminescent layer, and the four kinds of amine-oxide-group-containing conjugated polymers (PF6NO, PF6NO25Py, PF6NO26Py and PF6NO35Py) and their precursor polymers (PF6N, PF6N25Py, PF6N26Py and PF6N35Py) as the cathode interface modification layer respectively. In these figures, it can be obviously seen that the addition of the four kinds of the amine-oxide-group-containing conjugated polymers (PF6NO, PF6NO25Py, PF6NO26Py and PF6NO35Py) can significantly improve the brightness of the devices.

Figure 4:
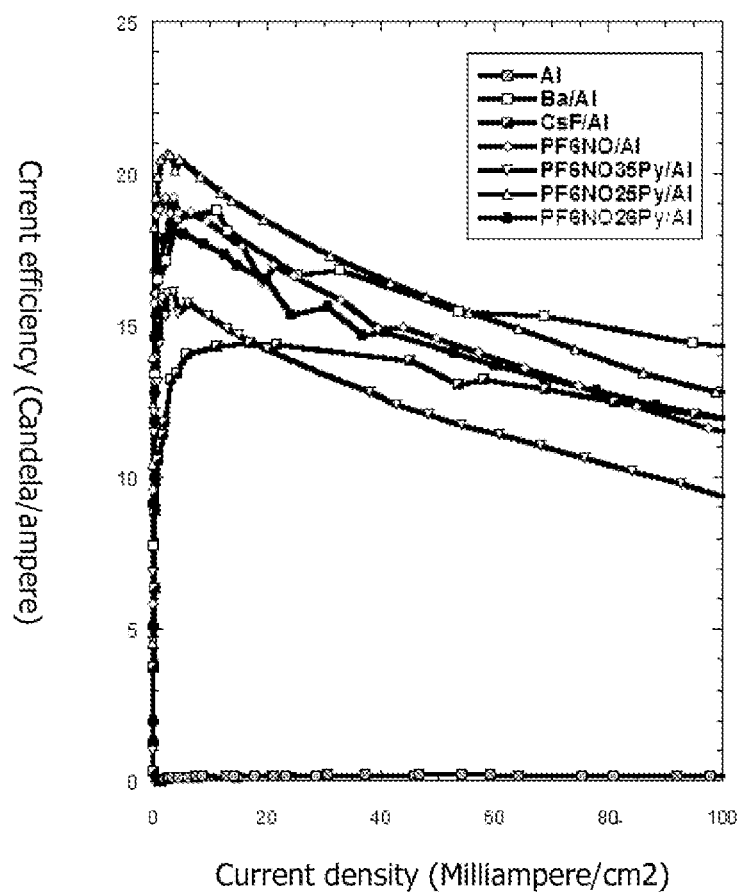
FIG. 4 is a current efficiency versus current density graph of the green light material P-PPV-based organic electroluminescence devices using the polymers PF6NO, PF6NO25Py, PF6NO26Py and PF6NO35Py synthesized in examples 1, 2, 3 and 4, as well as the reference CsF and Ba, as the cathode interface modification layer.
Figure 5:
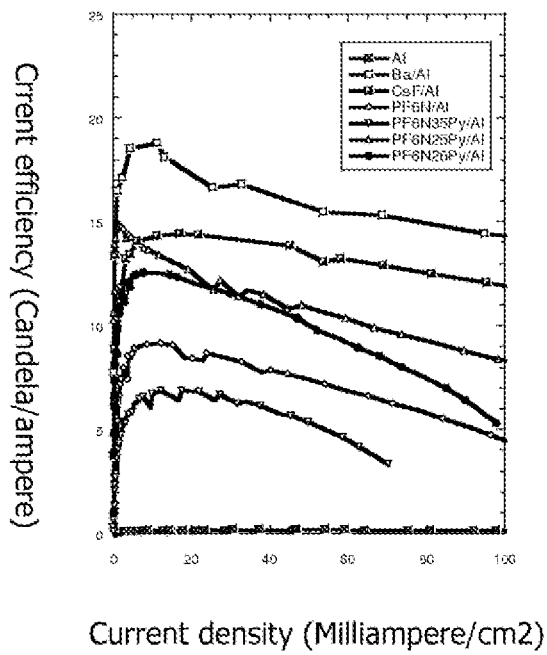
FIG. 5 a current efficiency versus current density graph of the green light material P-PPV-based organic electroluminescence devices using the precursors PF6N, PF6N25Py, PF6N26Py and PF6N35Py of the polymers PF6NO, PF6NO25Py, PF6NO26Py and PF6NO35Py synthesized in examples 1, 2, 3 and 4, as well as the reference CsF and Ba, as the cathode interface modification layer.

FIGS. 4 and 5, were the current efficiency versus current density graphs of the polymer luminescent diodes prepared by using a green light material-based polyphenyl substituted phenylenevinylene as a luminescent layer, and the four kinds of amine-oxide-group-containing conjugated polymers (PF6NO, PF6NO25Py, PF6NO26Py and PF6NO35Py) and their precursor polymers (PF6N, PF6N25Py, PF6N26Py and PF6N35Py) as the cathode interface modification layer respectively. In these figures; it can be seen that the addition of the four kinds of the amine-oxide-group-containing conjugated polymers (PF6NO, PF6NO25Py, PF6NO26Py and PF6NO35Py) can significantly improve the current efficiency of the devices.

Figure 6:
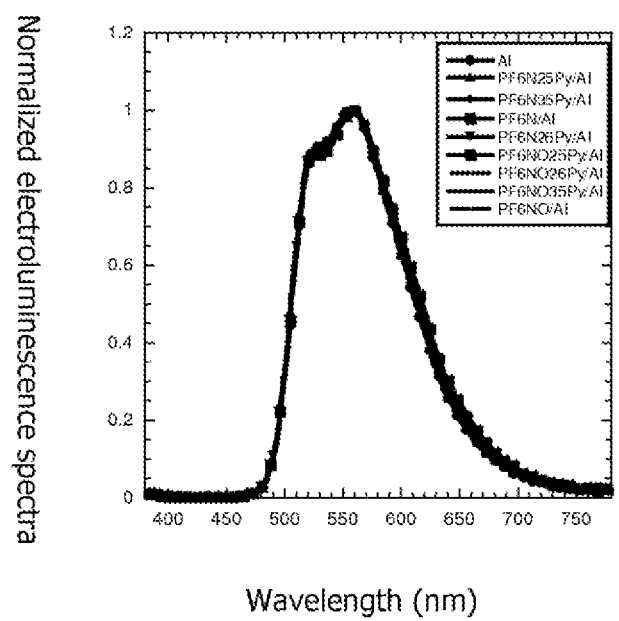
FIG. 6 is a normalized electroluminescence spectrogram of the organic electroluminescence devices using the polymer PF6NO, PF6NO25Py, PF6NO26Py and PF6NO35Py synthesized in examples 1, 2, 3 and 4, as well as their precursors PF6N, PF6N25Py, PF6N26Py and PF6N35Py as the cathode interface modification layer.

FIG. 6 was a normalized electroluminescence spectrogram of the organic electroluminescence devices of the polymer luminescent diodes prepared by using a green light material-based polyphenyl substituted phenylenevinylene P-PPV as a luminescent layer, and the four kinds of amine-oxide-group-containing conjugated polymers (PF6NO, PF6NO25Py, PF6NO26Py and PF6NO35Py) and their precursor polymers (PF6N, PF6N25Py, PF6N26Py and PF6N35Py) as the cathode interface modification layer respectively. In FIG. 6, it can be seen that of the current carrier complex domains of the devices were all in the P-PPV layer, the introduction of the cathode interface layer did not change the current carrier complex domains of the devices, the specific properties of the related devices were shown in table 1.

TABLE 1 the electroluminescence properties of the devices using PF6NO, PF6NO25Py, PF6NO26Py and PF6NO35Py as the cathode interface modification layer
the device structure ITO/PEDOT 4083/Active Layer (P-PPV, 80 nm)/ETL/Al (~80 nm)

| | Data at $LE_{max}$ | | | | $L_{max}$ |
|---|---|---|---|---|---|
| EML/ETL | LE (candela/ampere) | V (volt) | J(milliampere/cm$^2$) | $V_{on}$* (volt) | (candela/ampere) |
| P-PPV/PF6N | 9.18 | 10.2 | 11.0 | 4.0 | 4658 |
| P-PPV/PF6N25Py | 14.7 | 6.0 | 2.05 | 2.8 | 8633 |
| P-PPV/PF6N26Py | 12.6 | 8.4 | 7.44 | 3.4 | 5965 |
| P-PPV/PF6N35Py | 6.90 | 10.8 | 17.4 | 4.4 | 2704 |
| P-PPV/PF6NO | 19.2 | 5.6 | 3.58 | 2.6 | 13284 |
| P-PPV/PF6NO25Py | 20.7 | 4.6 | 2.38 | 2.6 | 19268 |
| P-PPV/PF6NO26Py | 19.3 | 5.4 | 4.88 | 2.8 | 16954 |
| P-PPV/PF6NO35Py | 16.1 | 6.0 | 5.44 | 3.0 | 9613 |
| P-PPV/— | 0.299 | 15.4 | 54.7 | 9.0 | 205.26 |
| P-PPV/CsF | 14.5 | 5.2 | 2.35 | 3.0 | 38109 |
| P-PPV/Ba | 18.7 | 3.8 | 10.9 | 2.5 | 42771 | wherein,
$LE_{max}$: maximum current efficiency,
LE: current efficiency,
V voltage, $V_{on}$: voltage when the brightness was 1 candela/m$^2$,
$L_{max}$: maximum brightness,
J: current density.

The above results has demonstrated that by employing the amine-oxide-group-containing conjugated polymer (PF6NO, PF6NO25Py, PF6NO26Py and PF6NO35Py) prepared in the present invention as a cathode interface modification layer, the performance of the conventional luminescent material in the devices having the high work function metal aluminum electrode can be significantly improved, the effects thereof can even exceed those of the amine group substituted precursor polymers (PF6N, PF6N25Py, PF6N26Py and PF6N35Py), and the device properties thereof had approached or exceeded those of the corresponding device using a low work function metal barium as a cathode.

The above-mentioned polar solvent, in addition to methanol, can be one or more of ethanol, water, N,N-dimethyl formamide, isopropanol, ethylene glycol, ethylene glycol monomethyl ether, etc.

Example 7

Illustration of the Use of the Polymers as a Cathode Interface Modification Material in the Organic/Polymer Solar Cell Device (ITO Anode/Hole Transfer Layer/Active Layer/Cathode Interface Modification Layer/Aluminum Cathode), with the Polymer PF6NO25Py Synthesized in Example 2 as an Example The use process of the amine-oxide-group-containing conjugated polymer photoelectric material proposed in the present invention in the polymer solar devices will be illustrated by the following example, but the present invention is not limited thereto.

The ITO electrically conductive glasses, square resistance ~20 Ohm/cm$^2$, were precut into 15 mm×15 mm square sheets. The square sheets were carried out an ultrasonic cleaning with acetone, the specific detergent for the micrometer scale semiconductor, deionized water and isopropanol successively, purged with nitrogen gas, then placed in a constant temperature oven for use. Prior to use, the ITO glass sheets were bombarded with plasmas for 10 min in an oxygen plasma etching instrument. The PEDOT:PSS aqueous dispersion solution (~1%) was purchased from Bayer Company, the buffering layer was spin-coated at a high speed with a Spin-Coater (KW-4A), the thickness was depended on the solution concentration and rotation speed, and was monitored in-time with a surface profilometer (Tritek Co., Alpha-Tencor-500 type). After a membrane was formed, the solvent resides were removed off in a constant temperature vacuum oven, and the membrane was erected. The sputtered PEDOT:PSS membrane on the ITO substrate was preferred to have a thickness of about 40 nm.

The active layer donor material conjugated polymer PCDTBT and the receptor material PC$_{71}$BM were weighted in a clean bottle (at a mass ratio of 1:4), then transferred to a special film-forming glove box (VAC Company) under nitrogen protection, dissolved in an orthodichlorobenzene/chlorobenzene mixed solvent (at a volume ratio of 3:1), filtrated through a 0.45 μm filter membrane. The PCDTBT/PC$_{71}$BM membrane was sputtered on the PEDOT:PSS membrane, with an optimum thickness of 7090 nm. The thickness of the membrane was determined with an Alpha-Tencor-500 surface profilometer. The amine-oxide-group-containing conjugated polymer PF6NO25Py and the amine group substituted precursor polymer PF6N25Py were placed in a clean bottle, then transferred to a special film-forming glove box under nitrogen protection, formulated into a solution with a concentration of 0.5% using a polar solvent methanol, placed on a stirring platform and stirred to homogenous, filtrated through a 0.45 μm filter membrane, thus obtaining a clear solution. The solution was spin-coated as a cathode interface modification layer on an active layer. Aluminum (80 nm) was plated on the cathode interface modification layer by vacuum vaporization as a cathode. The vacuum level in the plating cavity was below 3×10$^{-4}$ Pa, and the film plating rate and the metal electrode membrane thickness of each layer were monitored in-time by a quartz oscillator film thickness monitor (Type STM-100, manufactured by Sycon Co.). The preparation processes were all carried out in the glove box under nitrogen atmosphere. The current-voltage properties of the devices were measured by a Keithley236 current-voltage measurement system and a calibrated silicon photoelectric diode. The energy conversion efficiency of the device was measured by a standard solar spectrum AM1.5G simulator (Oriel model 91192). The sunlight-simulating energy was calibrated to 100 milliwatt/cm$^2$ using a standard silicon solar cell before test. In order to show the effect of the cathode interface modification layer used in the present invention, Al was plated on the active layer by vacuum evaporation, as a cathode. The relationship between the current density and the voltage of the device under illumination was shown in FIG. 7, and the relationship between the current density and the voltage of the device in dark was shown in FIG. 8.

Figure 7:
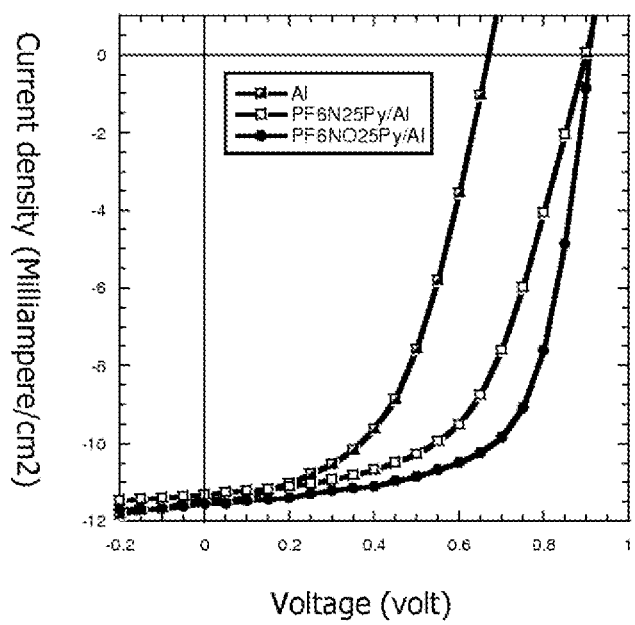
FIG. 7 shows the relationship between the current density and voltage of the PCDTBT:$PC_{71}BM$-based solar cell devices using the polymer PF6NO25Py synthesized in example 2 and its precursor PF6N25Py as the cathode interface modification layer, under a light irradiation of 100 milliwatt/$cm^2$, AM 1.5 G.

FIG. 7 was a current density versus voltage graph of the polymer solar cell prepared by using polycarbazoldithiophenbenzothidiazole (PCDTBT)/fullerene derivative (PC$_{71}$BM) as an active layer, and the amine-oxide-group-containing conjugated polymer PF6NO25Py and its precursor polymer PF6N25P as the cathode interface modification layer respectively, under the illumination of 100 milliwatt/cm$^2$, AM 1.5 G. In FIG. 7, it can be seen that the addition of the amine-oxide-group-containing conjugated polymer PF6NO25Py can significantly improve the open circuit voltage and short circuit current of the devices, and the specific properties of the related devices were shown in table 2.

Figure 8:
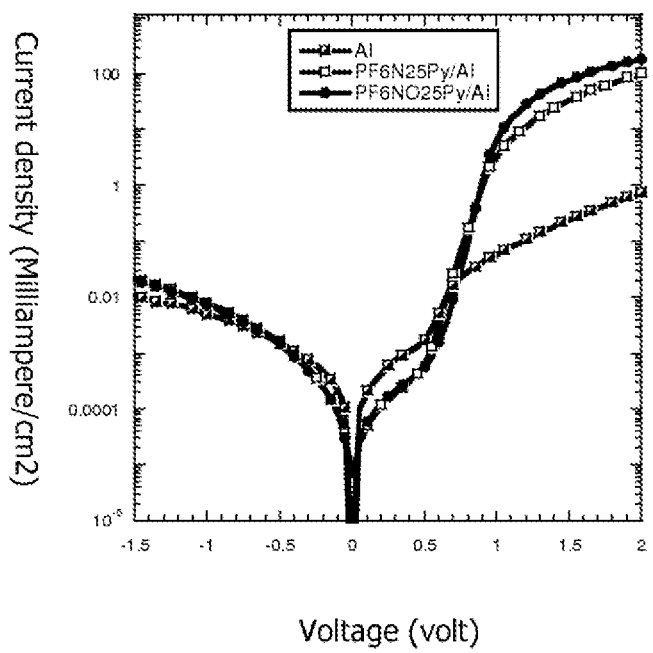
FIG. 8 shows the relationship between the current density and voltage of the PCDTBT:$PC_{71}BM$-based solar cell device using the polymer PF6NO25Py synthesized in example 2 and its precursor PF6N25Py as the cathode interface modification layer, in dark.

FIG. 8 was a relationship between the current density and voltage of the polymer solar cell prepared by using polycarbazoldithiophenbenzothidiazole (PCDTBT)/fullerene derivative (PC$_{71}$BM) as an active layer, and the amine-oxide-group-containing conjugated polymer PF6NO25Py and its precursor polymer PF6N25Py as the cathode interface modification layer respectively, in dark. In FIG. 8, it can be seen that after introduction of the cathode interface layer, the pickup voltage of the device was increased by 0.5~0.6 V as compared to that of the device with a pure aluminum cathode, which demonstrated that the introduction of the cathode interface layer can improve the built-in potential of the device, thus improving the open circuit voltage of the device.

TABLE 2 the performance of the solar cell devices using PF6NO25Py as a cathode interface modification layer
the device structure ITO/PEDOT 4083/Active Layer (PCDTBT/PC$_{71}$BM, 80 nm)/ETL/Al (~80 nm)

| Active Layer | ETL | $J_{sc}$(milliampere/cm$^2$) | $V_{oc}$ (volt) | FF (%) | PCE (%) |
|---|---|---|---|---|---|
| PCDTBT:PC$_{71}$BM (1:4) | — | 11.41 | 0.65 | 53.79 | 3.99 |
| | PF6N25Py | 11.31 | 0.90 | 56.00 | 5.70 |
| | PF6NO25Py | 11.55 | 0.91 | 66.18 | 6.88 |

Wherein,
$J_{sc}$: short circuit current,
$V_{oc}$: open circuit voltage,
FF: fill factor,
PCE: energy conversion efficiency The above results demonstrated that by employing the amine-oxide-group-containing conjugated polymer PF6NO25Py prepared in the present invention as a cathode interface modification layer, the performance of the conventional cell material in the device having the high work function metal aluminum electrode can be significantly improved, the effect thereof can even exceed that of the amine group substituted precursor polymer PF6N25Py.

The above-mentioned polar solvent, in addition to methanol, can be one or more of ethanol, water, N,N-dimethyl formamide, isopropanol, ethylene glycol, ethylene glycol monomethyl ether, etc.

The invention claimed is:

1. An amine-oxide-group-containing conjugated polymer photoelectric material, having the following structure:

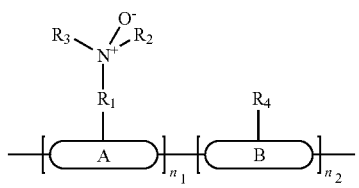

wherein:
$n_1+n_2=100\%$;
$R_1$, $R_2$, $R_3$, and $R_4$ are each independently a linear, branched, or cyclic C1~C20 alkyl chain or a C1~C20 alkoxy chain; and
A and B are conjugated main chain units each having one or more of the following structures:

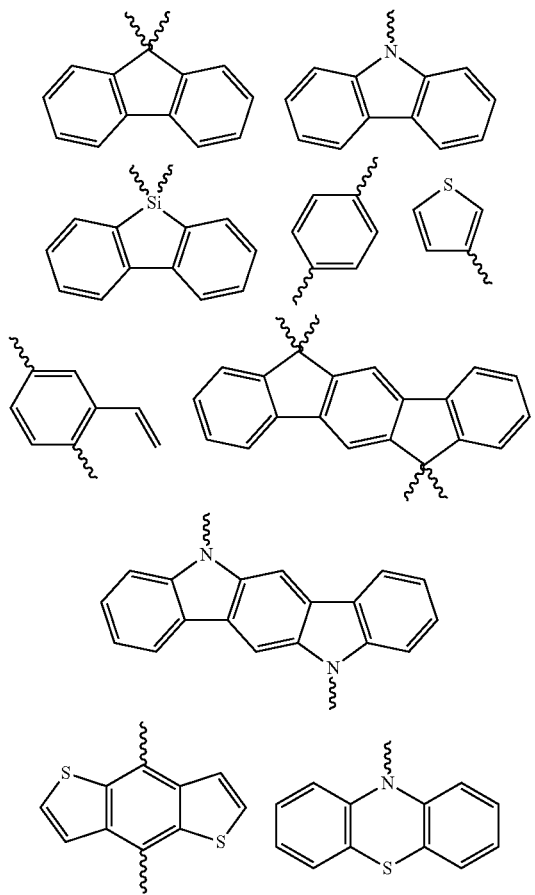

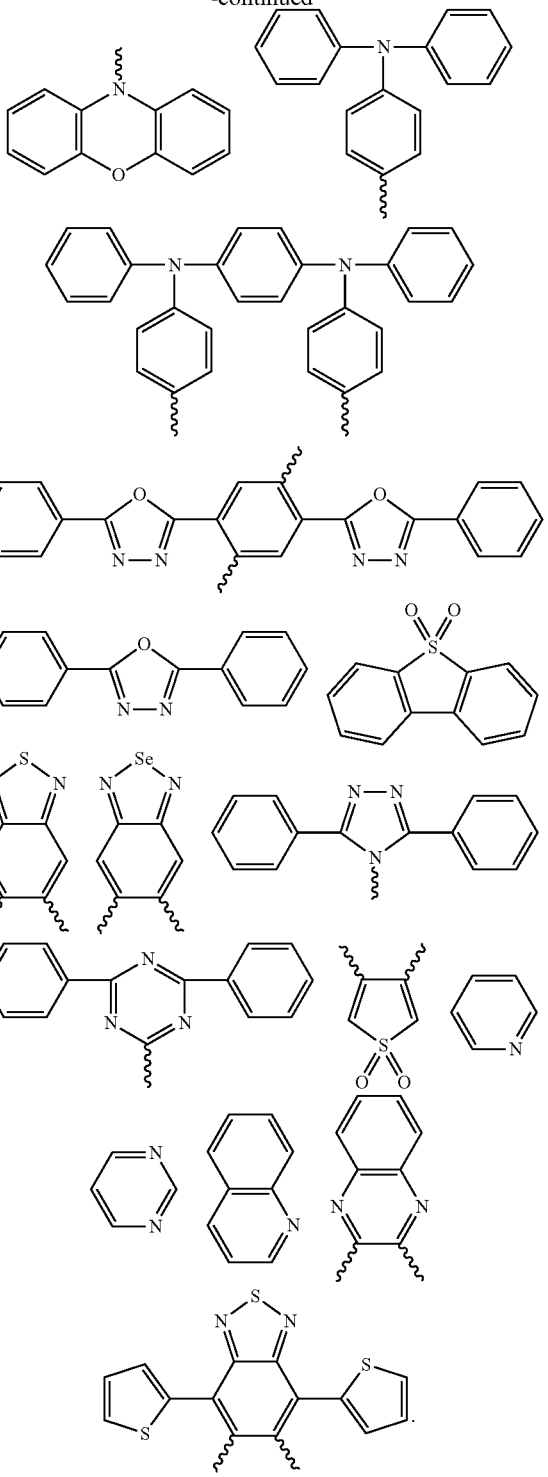

wherein ~~~ represents a covalent bond to $R_1$ or $R_4$.

2. The amine-oxide-group-containing conjugated polymer photoelectric material according to claim 1, wherein;
one or more carbon atoms in $R_1$-$R_4$ are substituted by an oxygen atom, a hydroxy group, an amino group, a sulfonyl group, an alkenyl group, an alkynyl group, an aryl group, an ester group, or a carbonyl group, and
one or more hydrogen atoms in $R_1$-$R_4$ are substituted by a fluorine atom, a hydroxy group, an amino group, a sulfonyl group, an alkenyl group, an alkynyl group, an aryl group, an ester group, or a carbonyl group.

* * * * *